(12) United States Patent
Gorman et al.

(10) Patent No.: US 8,872,322 B2
(45) Date of Patent: Oct. 28, 2014

(54) STACKED CHIP MODULE WITH INTEGRATED CIRCUIT CHIPS HAVING INTEGRATABLE BUILT-IN SELF-MAINTENANCE BLOCKS

(71) Applicant: International Businesss Machines Corporation, Armonk, NY (US)

(72) Inventors: Kevin W. Gorman, Fairfax, VT (US); Derek H. Leu, Hopewell Junction, NY (US); Krishnendu Mondal, Bangalore (IN); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 13/656,844

(22) Filed: Oct. 22, 2012

(65) Prior Publication Data

US 2014/0110711 A1 Apr. 24, 2014

(51) Int. Cl.
*G01R 31/28* (2006.01)
(52) U.S. Cl.
USPC ......... 257/686; 257/46; 257/E21.521; 438/18
(58) Field of Classification Search
CPC ................................ H01L 22/34; H01L 24/43
USPC ....................... 257/46, 686, E21.521; 438/18
See application file for complete search history.

(56) References Cited

U.S. PATENT DOCUMENTS

| | | | |
|---|---|---|---|
| 5,946,545 A | 8/1999 | Bertin et al. | |
| 5,968,192 A | 10/1999 | Kornachuk et al. | |
| 6,560,740 B1 | 5/2003 | Zuraski, Jr. et al. | |
| 7,184,915 B2 | 2/2007 | Hansquine et al. | |
| 7,216,278 B2 | 5/2007 | Andreev et al. | |
| 7,304,355 B2 | 12/2007 | Zhang | |
| 7,379,316 B2 | 5/2008 | Rajan | |
| 7,599,205 B2 | 10/2009 | Rajan | |

(Continued)

FOREIGN PATENT DOCUMENTS

| | | |
|---|---|---|
| JP | 2004-0253046 | 9/2004 |
| JP | 2010-027658 | 2/2010 |
| KR | 1020050028934 A | 3/2005 |
| WO | 0 173 459 A2 | 10/2001 |

OTHER PUBLICATIONS

U.S. Appl. No. 13/656,836.*

(Continued)

*Primary Examiner* — John C Ingham
(74) *Attorney, Agent, or Firm* — Gibb & Riley, LLC; David A. Cain, Esq.

(57) ABSTRACT

Disclosed is a stacked chip module and associated method with integrated circuit (IC) chips having integratable built-in self-maintenance blocks. The module comprises a stack of chips and each chip comprises a self-maintenance block with first and second controllers. The first controller controls wafer-level and module-level servicing (e.g., self-testing or self-repairing) of an on-chip functional block. The second controller provides an interface between an off-chip tester and the first controller during wafer-level servicing. Each chip further comprises a plurality of interconnect structures (e.g., multiplexers and through-substrate-vias) that integrate the self-maintenance blocks of adjacent chips in the stack so that, during module-level servicing, a single second controller on a single one of the chips in the stack (e.g., the bottom chip) provides the only interface between the off-chip tester and all of the first controllers.

25 Claims, 5 Drawing Sheets

(56) References Cited

U.S. PATENT DOCUMENTS

| | | |
|---|---|---|
| 7,631,236 B2 | 12/2009 | Gorman et al. |
| 7,702,975 B2 | 4/2010 | Gorman et al. |
| 7,735,031 B2 | 6/2010 | Chickanosky et al. |
| 7,763,911 B2 | 7/2010 | Zhang |
| 7,797,594 B1 | 9/2010 | Parulkar et al. |
| 7,895,028 B2 | 2/2011 | Anand et al. |
| 8,040,745 B2 | 10/2011 | Shibata |
| 8,060,774 B2 | 11/2011 | Smith et al. |
| 8,080,442 B2 | 12/2011 | Leedy |
| 8,124,429 B2 | 2/2012 | Norman |
| 2006/0156134 A1 | 7/2006 | Mukherjee et al. |
| 2006/0179377 A1 | 8/2006 | Dawson et al. |
| 2007/0001708 A1 | 1/2007 | Bertin et al. |
| 2007/0096759 A1 | 5/2007 | Weinraub |
| 2008/0068039 A1 | 3/2008 | Bernstein et al. |
| 2008/0215944 A1 | 9/2008 | Averbuj et al. |
| 2010/0332177 A1 | 12/2010 | Wu et al. |

OTHER PUBLICATIONS

RD 439133 A, "A Method for Scan Based Memory Test to Supplement Built-in Self-Test has ABIST Controller to Load and Execute a Unique Pattern to All Arrays in Parallel," Derwent-Acc-No. 2002-120410, Nov. 10, 2000, 1 page.

IPCOM000168299D, "Method of Utilizing Thermal Diodes for Power Generation and Cooling in Stacked Multi-Chip Modules," Mar. 5, 2008, 3 pages.

U.S. Appl. No. 13/656,836, Notice of Allowance dated Jun. 6, 2014, 3 pages.

Appendix P, "List of IBM Patents or Patent Applications Treated as Related", Jun. 18, 2014, 1 page.

U.S. Appl. No. 13/656,836, Office Action Communication dated Mar. 24, 2014, 16 pages.

* cited by examiner

STACKED CHIP MODULE WITH INTEGRATED CIRCUIT CHIPS HAVING INTEGRATABLE BUILT-IN SELF-MAINTENANCE BLOCKS

BACKGROUND

1. Field of the Invention

The disclosed embodiments relate to stacked chip modules and, more particularly, to a stacked chip module with integrated circuit chips having integratable built-in self-maintenance blocks that allow for servicing (e.g., self-testing or self-repairing) of functional blocks (e.g., memory arrays) at both the wafer-level and stacked chip module-level.

2. Description of the Related Art

When individual integrated circuit (IC) chips are mounted side-by-side on a printed circuit board (PCB), they take up a significant amount of surface area. Additionally, signals are typically passed from chip to chip on the PCB through large high-power, high-speed links. Recently developed stacked chip modules (also referred to herein as stacked chip packages, three-dimensional (3D) chip stacks or 3D multi-chip modules) allow for reductions in form factor, interface latency and power consumption as well as an increase in bandwidth. These benefits stem from the fact that, within a stacked chip module, signals are passed through the chips using simple wire-based interconnects (e.g., through-substrate-vias (TSVs) and micro-controlled collapsed chip connections (C4-connections)). Thus, there is a reduction in wire delay, which results in corresponding reductions in interface latency and power consumption as well as an increase in bandwidth. Unfortunately, self-maintenance (i.e., self-servicing, such as self-testing and/or self-repairing) of the individual IC chips on a stacked chip module presents a number of special challenges and such self-maintenance is can be critical to ensure product reliability.

SUMMARY

In view of the foregoing disclosed herein are embodiments of a stacked chip module with integrated circuit chips having integratable built-in self-maintenance blocks to allow for servicing (e.g., self-testing or self-repairing) of functional blocks at both the wafer-level and the stacked chip module-level. Specifically, the stacked chip module can comprise a stack of integrated circuit chips. Each integrated circuit chip can comprise a functional block and a self-maintenance block. Each self-maintenance block can comprise a first controller and a second controller. The first controller can control both wafer-level and stacked chip module-level servicing of the functional block. The second controller can provide an interface between an off-chip tester and the first controller during wafer-level servicing. Each integrated circuit chip can further comprise a plurality of interconnect structures (e.g., multiplexers and through-substrate-vias) that integrate the self-maintenance blocks of adjacent integrated circuit chips in the stack so that, during stacked chip module-level servicing, a single second controller on a single one of the integrated circuit chips in the stack (e.g., the bottom integrated circuit chip in the stack) provides the only interface between the off-chip tester and all of the first controllers. Also disclosed herein are embodiments of an associated method of manufacturing and serving such a stacked chip module.

Specifically, disclosed herein are embodiments of a stacked chip module. The stacked chip module can comprise a stack of integrated circuit chips. Each of the integrated circuit chips in the stack can comprise a substrate and, on the substrate, a functional block, a self-maintenance block for servicing (e.g., self-testing or self-repairing) of the functional block, and a plurality of interconnect structures.

The functional block on each chip can comprise a memory array. For example, the functional block can comprise a dynamic random access memory (DRAM) array, a static random access memory (SRAM) array, or any other suitable memory array. Alternatively, the functional block can comprise another other type of digital or analog circuit capable of being subject to self-maintenance.

The self-maintenance block can comprise a first controller and a second controller. The first controller can control servicing of the functional block during both wafer-level servicing (i.e., before the integrated circuit chip is incorporated into the stack chip module) and during stacked chip module-level servicing (i.e., after the integrated circuit chip is incorporated into the stacked chip module). The second controller can provide an interface between an off-chip tester and the first controller during the wafer-level servicing.

The interconnect structures on each chip can integrate the self-maintenance block with any adjacent self-maintenance blocks of any adjacent integrated circuit chips in the stack such that, during stacked chip module-level servicing, a single second controller on a single integrated circuit chip in the stack provides the only interface between the off-chip tester and each first controller on each of the integrated circuit chips in the stack.

For example, in one embodiment of the stacked chip module, the interconnect structures on each chip can comprise a plurality of multiplexers and through-substrate-vias that integrate the self-maintenance block with any adjacent self-maintenance blocks of any adjacent integrated circuit chips in the stack such that, during stacked chip module-level servicing, a single second controller on the bottom integrated circuit chip in the stack provides the only interface between the off-chip tester and each first controller on each of the integrated circuit chips in the stack.

Also disclosed herein are embodiments of a stacked chip module manufacturing and servicing method. The method can comprise manufacturing integrated circuit chips to be incorporated into a stacked chip module. Each integrated circuit chip can be manufactured such that it comprises a substrate and, on the substrate, a functional block, a self-maintenance block for servicing (e.g., self-testing or self-repairing) of the functional block, and a plurality of interconnect structures (e.g., a plurality of multiplexers and through-substrate-vias). The functional block on each chip can comprise a memory array. For example, the functional block can comprise a dynamic random access memory (DRAM) array, a static random access memory (SRAM) array, or any other suitable memory array. Alternatively, the functional block can comprise another other type of digital or analog circuit capable of being subject to self-maintenance.

Then, wafer-level servicing of the functional block of each integrated circuit chip can be performed using the on-chip self-maintenance block. Such wafer-level servicing can comprise controlling, by a first controller of the self-maintenance block on the integrated circuit chip, servicing of the functional block. Such wafer-level servicing can further comprise providing, by a second controller of the self-maintenance block on the integrated circuit chip, an interface between an off-chip tester and the first controller.

After the wafer-level servicing of each integrated circuit chip is performed, the integrated circuit chips can be packaged into the stacked chip module. Specifically, the integrated circuit chips can be arranged in a stack and the self-maintenance block on each integrated circuit chip can be integrated with any adjacent self-maintenance blocks of any adjacent integrated circuit chips in the stack using the interconnect structures (e.g., using the multiplexers and through-substrate-vias).

Once the integrated circuit chips are packaged into the stacked chip module, stacked chip module-level servicing of the functional blocks on the integrated circuit chips in the stack can be performed such that, during the stacked chip module-level servicing, a single second controller on a single integrated circuit chip in the stack (e.g., the bottom integrated circuit chip in the stack) provides the only interface between the off-chip tester and each first controller on each of the integrated circuit chips in the stack.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
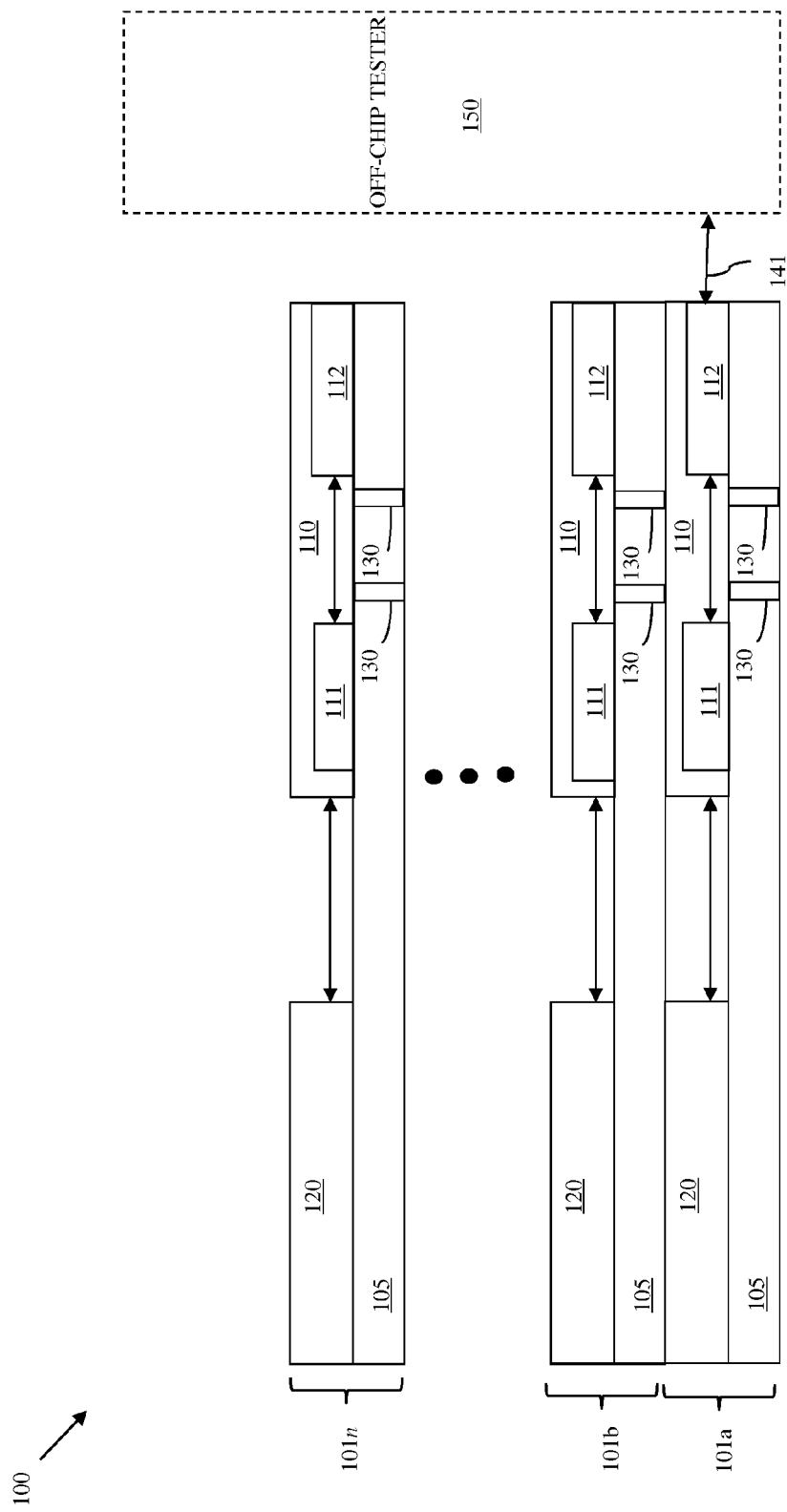
FIG. 1 is a schematic diagram illustrating an embodiment of a stacked chip module.

As mentioned above, when individual integrated circuit (IC) chips are mounted side-by-side on a printed circuit board (PCB), they take up a significant amount of surface area. Additionally, signals are typically passed from chip to chip on the PCB through large high-power, high-speed links. Recently developed stacked chip modules (also referred to herein as stacked chip packages, three-dimensional (3D) chip stacks or 3D multi-chip modules) allow for reductions in form factor, interface latency and power consumption as well as an increase in bandwidth. These benefits stem from the fact that, within a stacked chip module, signals are passed through the chips using simple wire-based interconnects (e.g., through-substrate-vias (TSVs) and micro-controlled collapsed chip connections (C4 connections)). Thus, there is a reduction in wire delay, which results in corresponding reductions in interface latency and power consumption as well as an increase in bandwidth. Unfortunately, self-maintenance (i.e., self-servicing, such as self-testing and/or self-repairing) of the individual IC chips on a stacked chip module presents a number of special challenges and such self-maintenance is can be critical to ensure product reliability.

For example, IC chips and, particularly, IC chips that incorporate memory arrays often also incorporate one or more built-in self-maintenance blocks (e.g., a built-in self-test (BIST) circuit and, optionally, a built-in self-repair (BISR) circuit). The BIST circuit is used to efficiently test the memory elements in the arrays and determine if repairs are necessary. The BISR circuit determines which repairs are necessary and can also usually dictate how those repairs are recorded in fuses such that after testing is completed, the repairs can be completed. The BIST and BISR circuits are specifically designed for use at the wafer-level (i.e., on a two dimensional (2D) structure). However, such built-in self-maintenance blocks typically become ineffectual when the IC chips are subsequently packaged into stacked chip modules (i.e., on 3D structures) because they are not integrated between the IC chips and, thereby do not allow for stacked chip module-level self-maintenance. Therefore, it would be advantageous to provide a stacked chip module where the IC chips have integratable built-in self-maintenance blocks in order to allow for servicing (e.g., self-testing or self-repairing) at both the wafer-level and the stacked chip module-level.

In view of the foregoing disclosed herein are embodiments of a stacked chip module with integrated circuit chips having integratable built-in self-maintenance blocks to allow for servicing (e.g., self-testing or self-repairing) of functional blocks at both the wafer-level and the stacked chip module-level. Specifically, the stacked chip module can comprise a stack of integrated circuit chips. Each integrated circuit chip can comprise a functional block and a self-maintenance block. Each self-maintenance block can comprise a first controller and a second controller. The first controller can control both wafer-level and stacked chip module-level servicing of the functional block. The second controller can provide an interface between an off-chip tester and the first controller during wafer-level servicing. Each integrated circuit chip can further comprise a plurality of interconnect structures (e.g., multiplexers and through-substrate-vias) that integrate the self-maintenance blocks of adjacent integrated circuit chips in the stack so that, during stacked chip module-level servicing, a single second controller on a single one of the integrated circuit chips in the stack (e.g., the bottom integrated circuit chip in the stack) provides the only interface between the off-chip tester and all of the first controllers. Also disclosed herein are embodiments of an associated method of manufacturing and serving such a stacked chip module.

Specifically, referring to FIG. 1, disclosed herein are embodiments of stacked chip module 100. The stacked chip module 100 can comprise a stack of integrated circuit chips 101a-101n. For purposes of illustration, the stacked chip module 100 is shown as having three stacked integrated circuit chips. However, it should be understood that the stacked chip module 100 can, alternatively, comprise any number of two or more integrated circuit chips.

Each of the integrated circuit chips 101a-101n in the stack can comprise a substrate 105 and, on the substrate 105, a functional block 120, a self-maintenance block 110 for servicing (e.g., self-testing or self-repairing) of the functional block 120, and a plurality of interconnect structures 130.

The functional block 120 on each chip 101a-101n can comprise a memory array. For example, the functional block 120 can comprise a dynamic random access memory (DRAM) array, a static random access memory (SRAM) array, or any other suitable memory array. Alternatively, the functional block can comprise another other type of digital or analog circuit capable of being subject to self-maintenance (i.e., self-test or self-repair).

The self-maintenance block 110 on each chip 101a-101n can be, for example, a built-in self-test (BIST) circuit for testing the functional block 120 or a built-in self-repair circuit for repairing the functional block 120. In either case, the self-maintenance block 110 can comprise controllers (e.g., embedded processors) and, particularly, a first controller 111 and a second controller 112. The first controller 111 can control (i.e., can be adapted to control, can be configured to control, can be programmed to control, etc.) servicing of the functional block 120 during wafer-level servicing (i.e., before the integrated circuit chip is incorporated into the stack chip module). That is, in the case of a BIST circuit, the first controller 111 can comprise a BIST controller that controls self-testing of the functional block 120 during wafer-level self-testing. For example, the BIST controller can control memory testing and gather diagnostic data during such memory testing. In the case of a BISR circuit, the first controller 111 can comprise a FUSE controller that controls self-repairing of the functional block 120 during wafer-level self-repairing. For example, the Fuse controller can acquire memory repair data and can control compression and blowing of that memory repair data into fuses for subsequent memory repair. The second controller 112 (also referred to herein as a clock controller) can provide (i.e., can be adapted to provide, can be configured to provide, can be programmed to provide, etc.) an interface (not shown) between an off-chip tester and the first controller 111 during the wafer-level servicing as well as required signal buffering. BIST circuits and BISR circuits used for wafer-level servicing are well-known in the art and thus further details of such BIST circuits and BISR circuits are omitted from this disclosure in order to allow the reader to focus on the salient aspects of the embodiments.

The interconnect structures 130 on each chip 101a-101n can comprise a combination of different types of interconnect structures such as, wires, through-substrate-vias (TSVs), controlled collapsed chip connections (C4-connections), multiplexers, switches, and/or logic gates. These interconnect structures 130 can integrate the self-maintenance block 110 on each of the integrated circuit chips 101a-101n in the stack with any adjacent self-maintenance blocks of any adjacent integrated circuit chips in the stack by providing the required electrical connections such that, during stacked chip module-level servicing (i.e., during servicing, after the integrated circuit chips are packaged into the stacked chip module), the first controllers 111 on each of the integrated circuit chips 101a-101n continue to control servicing of their respective functional blocks 120, but a single second controller 112 on a single integrated circuit chip in the stack provides the only interface 141 between the off-chip tester 150 and each first controller 111 on each of the integrated circuit chips 101a-101n in the stack. In this case, the second controllers 112 on each of the other integrated circuit chips in the stack simply provide the required buffering needed during servicing.

For example, in one embodiment of the stacked chip module 100, the interconnect structures 130 on each chip 105 can comprise a combination of a plurality of multiplexers and through-substrate-vias (TSVs) that integrate the self-maintenance block 110 with any adjacent self-maintenance blocks of any adjacent integrated circuit chips in the stack such that, during stacked chip module-level servicing, the first controllers 111 on each of the integrated circuit chips 101a-101n continue to control servicing of their respective functional blocks 120 but a single second controller 112 on the bottom integrated circuit chip 101a in the stack provides the only interface 141 between the off-chip tester 150 and each first controller 111 on each of the integrated circuit chips 101a-101n in the stack. In the case, the second controller 112 on each of the higher integrated circuit chips 101b-101n in the stack simply provide the required buffering needed for servicing.

Figure 2:
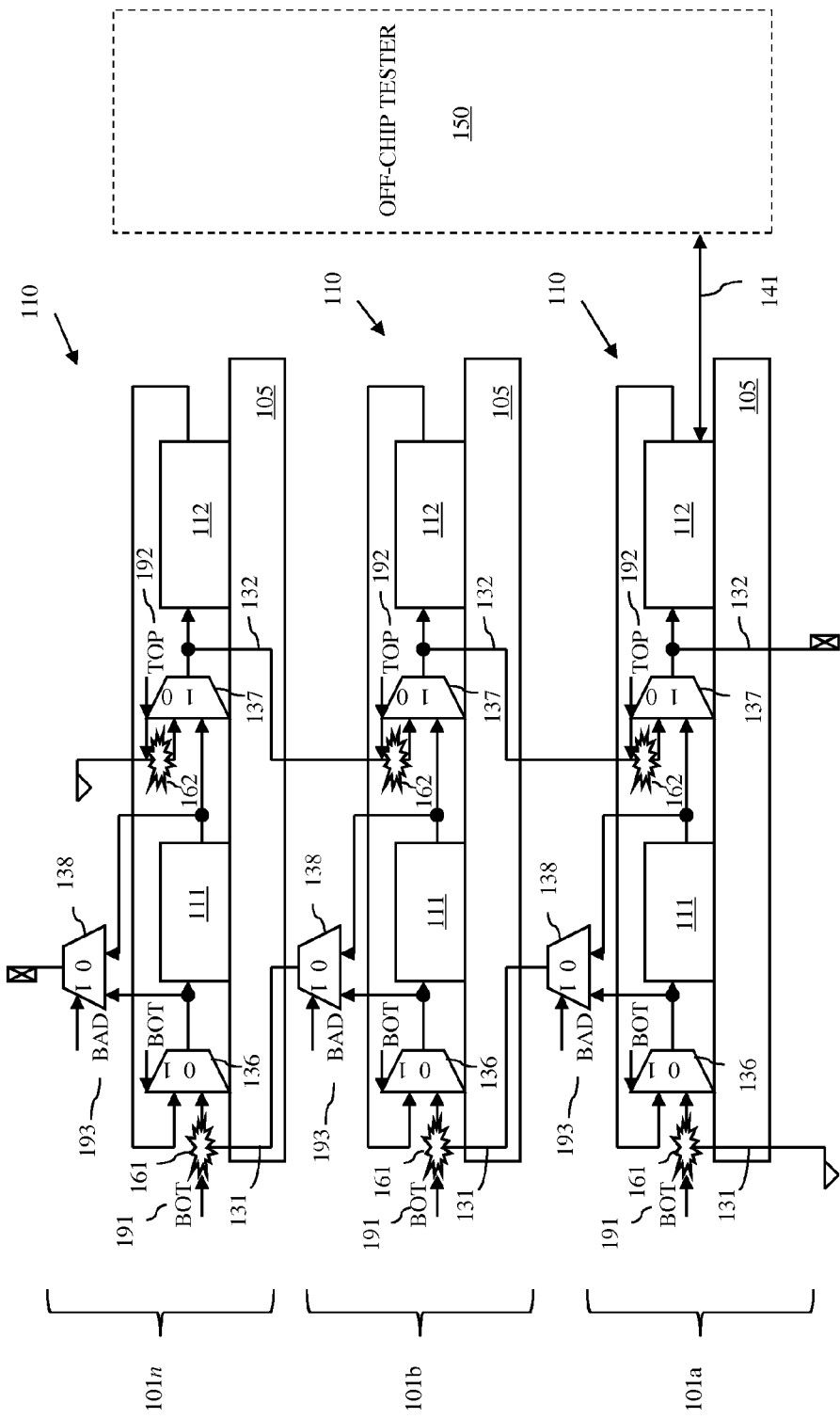
FIG. 2 is a schematic diagram illustrating an embodiment of a stacked chip module.

Specifically, as shown in FIG. 2, the interconnect structures, which integrate the self-maintenance blocks 110 on each of the integrated circuit chips 101a-101n, can comprise first and second through-substrate-vias 131-132 and first, second and third multiplexers 136-138. The first multiplexer 136 can receive (i.e., can be adapted to receive, configured to receive, etc.) first input signals from the first through-substrate-via 131 and from the second controller 112. The first multiplexer 136 can further be controlled (i.e., can be adapted to be controlled, can be configured to be controlled, etc.) by a first control signal 191 that indicates whether or not the integrated circuit chip is the bottom integrated circuit chip 101a in the stack. The second multiplexer 137 can receive (i.e., can be adapted to receive, configured to receive, etc.) second input signals from the first controller 110 and from the second through-substrate-via 132 of a next higher integrated circuit chip in the stack. The second multiplexer 137 can be controlled (i.e., can be adapted to be controlled, can be configured to be controlled, etc.) by a second control signal 192 that indicates whether or not the integrated circuit chip is the top integrated circuit chip 101n in the stack. The third multiplexer 138 can receive (i.e., can be adapted to receive, configured to receive, etc.) third input signals from the first multiplexer 136 and the first controller 111 and can output (i.e., can be adapted to output, can be configured to output, etc.) an output signal to the first through-substrate-via 131 of the next higher integrated circuit chip in the stack. This third multiplexer 138 (i.e., can be adapted to be controlled, can be configured to be controlled, etc.) by a third control signal 193 that indicates the condition (e.g., defective or functional) of the first controller 111 and/or the second controller 112 on the integrated circuit chip.

During wafer-level servicing (i.e., servicing prior to packaging into the stacked chip module 100), the first control signal 191 and the second control signal 192 will always be a 1 indicating that the chip is both the bottom and the top integrated circuit chip (i.e., the only integrated circuit chip). Thus, signals from the second controller 112 on that integrated circuit chip will pass through the first multiplexer 136 to the first controller 111 so that the second controller 112 provides the required interface with the off-chip tester 150.

During stacked chip module-level servicing (i.e., servicing following packaging into the stacked chip module 100), the first control signal 191 will be a 1 for only the bottom integrated circuit chip 101a in the stack, otherwise it will be a 0. Similarly, the second control signal 192 will be a 1 for only the top integrated circuit chip 101n in the stack, otherwise it will be a 0. Thus, only on the bottom integrated circuit chip 101a in the stack will signals from the second controller 112 pass through the first multiplexer 136 to the first controller 111. In this case, the first control signal 191, which will be a 1 for the bottom integrated circuit chip 101a and a 0 for all others, causes an electrical connection to be formed from the second controller 112 on the bottom integrated circuit chip 101a through the first multiplexer 136, first controller 111 and third multiplexer 138 on that bottom integrated circuit chip 101 up through the first through-substrate-via 131 of the next higher integrated circuit chip 101b in the stack through the first multiplexer 136, first controller 111 and third multiplexer 138 on that next higher integrated circuit chip 101b and so on until the first controller 111 on the top integrated circuit chip 101n is reached. Then, the second control signal 192, which will be a 1 for the top integrated circuit chip 101n and a 0 for all others, causes a loopback electrical connection to be formed from the first controller 111 on the top integrated circuit chip 101n through the second multiplexer 137 and down through the second through-substrate-via 132 on that top integrated circuit chip 101n and the through each second multiplexer 137 and subsequent second through-substrate-via 132 on each of the lower integrated circuit chips in the stack in series until the bottom integrated circuit chip 101a is reached, at which point the connection is made to the second controller 112 on the bottom integrated circuit chip 101a. As mentioned above, the second controller 112 on each of the higher integrated circuit chips 101b-101n in the stack simply provide the required additional buffering needed for servicing.

Figure 3:
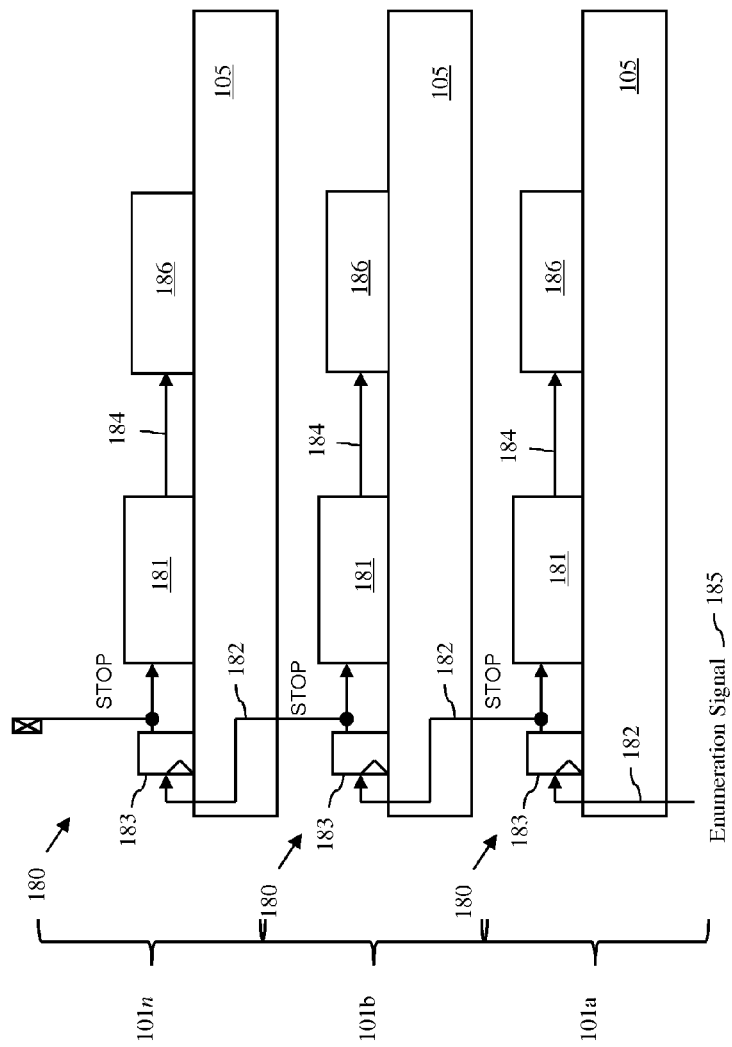
FIG. 3 is a schematic diagram illustrating exemplary enumeration circuitry that can be incorporated into each integrated circuit chip of a stacked chip module according to the embodiments disclosed herein.

Those skilled in the art will recognize that in order to integrate the self-maintenance blocks 110 of each of the integrated circuit chips 101a-101n in the stacked chip module 100, as described above and illustrated in FIG. 2, additional circuitry must be provided on each integrated circuit chip for chip level identification and subsequent first and second signal generation. That is, as illustrated in FIG. 3, each integrated circuit chip 101a-101n in the stack can further comprise enumeration circuitry 180 (i.e., chip level identification circuitry) on the substrate 105. The enumeration circuitry 180 on each integrated circuit chip 101a-101n can be electrically connected in series to any adjacent enumeration circuitry on any adjacent integrated circuit chips in the stack. The enumeration circuitry 180 can receive and process (i.e., can be adapted to receive and process) an enumeration signal 185 to determine a level of the integrated circuit chip in the stack and to output first and second control signals 191, 192. In one embodiment, each of the integrated circuit chips 101a-101n in the stack can further comprise an additional through-substrate-via 182 and the enumeration circuitry 180 can comprise a latch 183, a counter 181 and one or more registers 186 (i.e., comparators). The latch 181 can receive (i.e., can be adapted to receive, can be configured to receive, etc.) the enumeration signal 185 from the additional through-substrate-via 182. The counter 181 can be electrically connected in series with the latch 183 and can count (i.e., can be adapted to count, can be configured to count, etc.) the number 184 of cycles until the enumeration signal 185 is received. The register(s) 186 can be in communication with the counter 183, can receive (i.e., can be adapted to receive, can be configure to receive, etc.) a signal indicating that number 184 and can compare (i.e., can be adapted to compare, can be configured to compare, etc.) the number 184 to a predetermined minimum number in order to output the first control signal 191 (which indicates whether or not the integrated circuit chip is the bottom integrated circuit chip 101a in the stack) and further to a predetermined maximum number in order to output the second control signal 192 (which indicates whether or not the integrated circuit chip is the top integrated circuit chip 101n in the stack).

Figure 4:
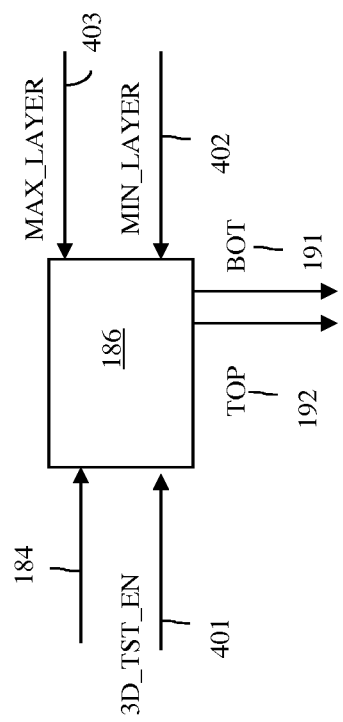
FIG. 4 is a schematic diagram illustrating of an exemplary register that can be incorporated into the enumeration circuitry of FIG. 3.

For example, as illustrated in FIG. 4, a single register 186 can be pre-programmed with information indicating the minimum number 402 of cycles that indicates the minimum layer (i.e., the bottom integrated circuit chip 101a) and the maximum number 403 of cycles that indicates the maximum layer (i.e., the top integrated circuit chip 101n). When stacked chip module-level servicing is enabled (as indicated by enable signal 401) the register 186 can receive the signal indicating the actual number 184 of cycles counted by the counter 181, can compare that number 184 to both the minimum number 402 and the maximum number 403 and can output (i.e., can be adapted to output, can be configured to output, etc.) both the first control signal 191 and the second control signal 192. As indicated above, the first control signal 191 will be a 1 for only the bottom integrated circuit chip 101a in the stack (i.e., when the number 184 is equal to the minimum number 402), otherwise it will be a 0. Similarly, the second control signal 192 will be a 1 for only the top integrated circuit chip 101n in the stack (i.e., when the number 184 is equal to the maximum number 403), otherwise it will be a 0. Alternatively, discrete registers could be used to determine and output the first and second control signals 191, 192.

It should be noted that the third multiplexers 138 on each of the integrated circuit chips 101a-101n allow stacked chip module-level servicing to proceed even in the event that the first controller 111 and/or the second controller 112 on any given integrated circuit chip was previously determined (e.g., during wafer-level servicing) to be defective. Specifically, as mentioned above, for a given integrated circuit chip the third control signal 193 can indicate the condition of the first controller 111 and/or the second controller 112. For example, the third control signal 193 will be a 1 if either or both the first controller 111 and the second controller 112 are defective, otherwise it will be a 0 (i.e., it will be a 0 only if both the first controller 111 and second controller 112 are functional). This status as defective 1 or functional 0 can, for example, be determined during wafer-level servicing and can be stored in any non-volatile memory (e.g., on-chip fuse, flash memory, etc.). Thus, in operation, when the third control signal 193 is a 0, the electrical connection formed during stacked chip module-level servicing will be formed as described in detail above. However, when the third control signal 193 is a 1, the integrated circuit chip with the defective first controller 111 and/or defective second controller 112 will be automatically bypassed without interrupting the connection. For example, if the first controller 111 and/or the second controller 112 of integrated circuit chip 101b is defective such that its third control signal 193 is a 1, the third multiplexer 138 on that integrated circuit chip 101b will pass the output signal from the first multiplexer 136 on the integrated circuit chip 101b directly up to the first through-substrate-via 131 of the next higher integrated circuit chip in the stack (and not pass on the output signal from the first controller 111 on that integrated circuit chip 101b).

It should further be noted that each integrated circuit chip 101a-101n can further comprise first termination logic 161 electrically connected between the first through-substrate-via 131 and the first multiplexer 136. This first termination logic 161 can be controlled by (i.e., can be adapted to be controlled by, can be configured to be controlled by, etc.) the first control signal 191 to ensure that, when the first through-substrate-via 131 is floating (i.e., unconnected to an integrated circuit chip below) in the case of the bottom integrated circuit chip 101a, it alternatively receives some constant input (e.g., it can be electrically connected to ground) so that an electrical short will not occur. Similarly, each integrated circuit chip 101a-101n can further comprise second termination logic 162 electrically connected to the second multiplexer 137. This second termination logic 162 can be controlled by (i.e., can be adapted to be controlled by, can be configured to be controlled by, etc.) the second control signal 192 to ensure that, when the second multiplexer 137 does not receive an input from a next higher integrated circuit chip in the stack in the case of the top integrated circuit chip 101n, it alternatively receives some constant input (e.g., it can be electrically connected to ground) so an electrical short will not occur.

By integrating the self-maintenance blocks 110 of adjacent integrated circuit chips in a stacked chip module 100, as described above, the single second controller 112 (e.g., on the bottom integrated circuit chip 101a), as controlled by the off-chip tester 150, can cause (i.e., can be adapted to cause, can be configured to cause, can be programmed to cause, etc.) the functional block 120 on each of the integrated circuit chips 101a-101n in the stack to be serviced in a variety of different manners during the stacked chip module-level servicing. For example, to reduce test time the functional block 120 on each of the integrated circuit chips 101a-101n in the stack can be serviced in parallel. Alternatively, to avoid noise/power issues, the functional block 120 on each of the integrated circuit chips 101a-101n in the stack can be serviced in series. Alternatively, to balance out the need for reduced test time with the need to avoid noise/power issues, servicing can be partitioned such that the functional blocks on each integrated circuit chip in a selected group of less than all of the integrated circuit chips (e.g., integrated circuit chips 101a and 101n only) in the stack are serviced in parallel.

Figure 5:
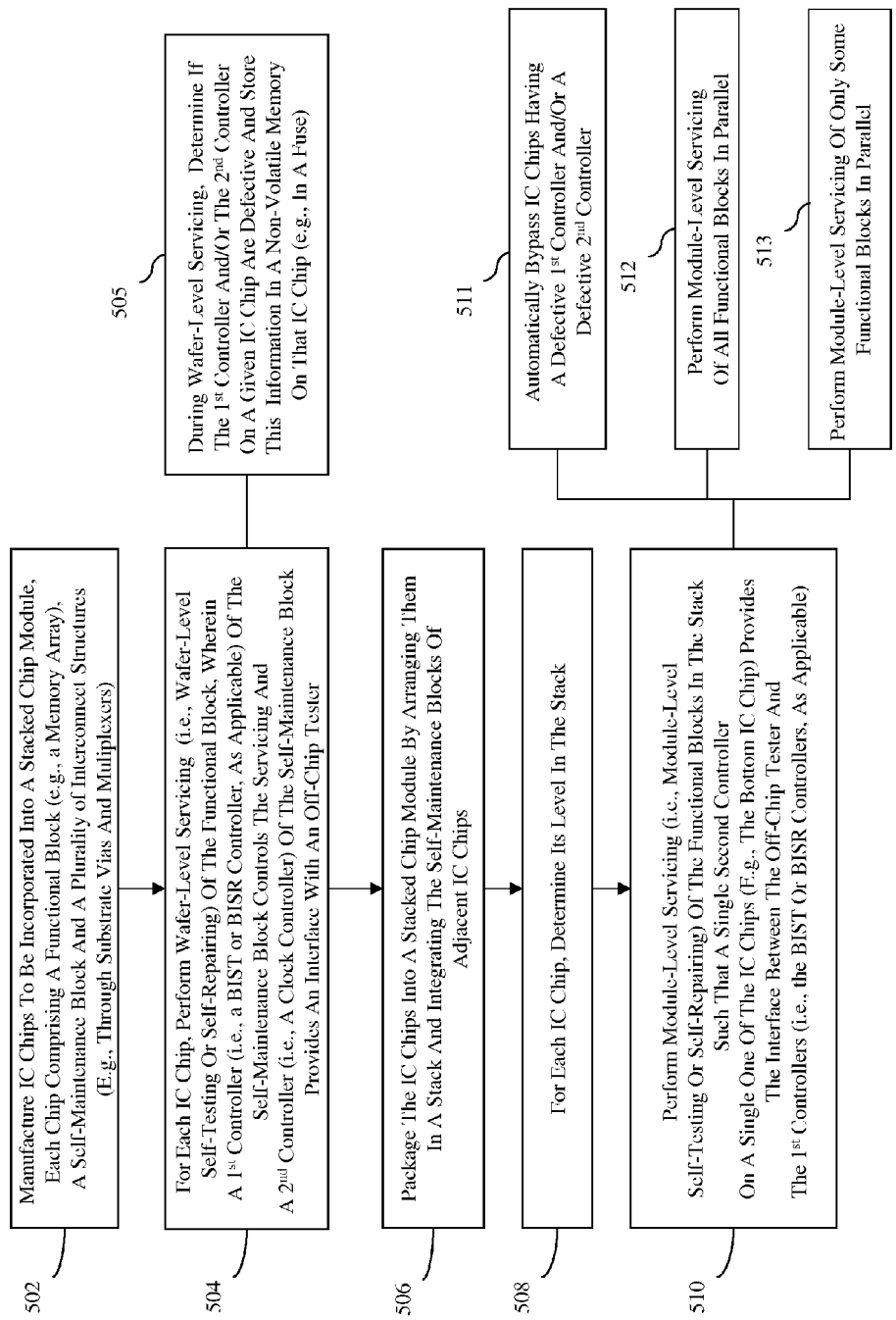
FIG. 5 is a flow diagram illustrating an embodiment of a stacked chip module manufacturing and servicing method.

Referring to FIG. 5, also disclosed herein are embodiments of a stacked chip module manufacturing and servicing method. The method can comprise manufacturing integrated circuit chips to be incorporated into a stacked chip module (502).

As shown in FIGS. 1-2 and described in detail above, each of the integrated circuit chips 101a-101n can be manufactured so as to comprise a substrate 105 and, on the substrate 105, a functional block 120, a self-maintenance block 110 for servicing (e.g., self-testing or self-repairing) of the functional block 120, and a plurality of interconnect structures 130. The functional block 120 can comprise a memory array. For example, the functional block 120 can comprise a dynamic random access memory (DRAM) array, a static random access memory (SRAM) array, or any other suitable memory array. Alternatively, the functional block can comprise another other type of digital or analog circuit capable of being subject to self-maintenance. The self-maintenance block 110 can be, for example, a built-in self-test (BIST) circuit for testing the functional block or a built-in self-repair circuit for repairing the functional block. In either case, the self-maintenance block 110 can comprise a first controller 111 and a second controller 112. The first controller 111 (e.g., a BIST controller in the case of a BIST circuit and a Fuse controller in the case of a BISR circuit) can be configured to control servicing (i.e., self-testing or self-repairing, as applicable) of the functional block. The second controller 112 (also referred to herein as a clock controller) can be configured to provide an interface between an off-chip tester and the first controller 111 as well as required signal buffering. The interconnect structures 130 can comprise a combination of different types of interconnect structures such as, wires, through-substrate-vias (TSVs) 131-132, controlled collapsed chip connections (C4-connections), multiplexers 136-138, switches, and/or logic gates that can be used to integrate (i.e. provide the electrical connections between) adjacent self-maintenance blocks when the integrated circuit chips are subsequently packaged into a stacked chip module at process 506. As shown in FIG. 3 and described in detail above, each of the integrated circuit chips 101a-101n can further be manufactured chip 101 so as to comprise enumeration circuitry 180 (i.e., chip level identification circuitry) on the substrate 105.

After the integrated circuit chips 101a-101n are manufactured at process 502, wafer-level servicing (i.e., servicing before the integrated circuit chip is incorporated into the stack chip module) of the functional block 120 of each integrated circuit chip 101a-101n can be performed using the on-chip self-maintenance block 110 (504). For each integrated circuit chip, such wafer-level servicing can comprise controlling, by the first controller 111 of the self-maintenance block 110, servicing of the functional block 120. For each integrated circuit chip, such wafer-level servicing can further comprise providing, by the second controller 112 of the self-maintenance block 110, an interface between an off-chip tester and the first controller 111. Additionally, such wafer-level servicing can comprise determining if the first controller 111 and/or the second controller 112 are defective and storing this information in a non-volatile memory on the integrated circuit chip (e.g., in an on-chip fuse) for later use during stacked chip module-level servicing at process 510 (505).

After the wafer-level servicing of each integrated circuit chip is performed at processes 504-505, the integrated circuit chips 101a-101n can be packaged into the stacked chip module 100, as shown in FIGS. 1-3 above (506). Specifically, the integrated circuit chips 101a-101n can be arranged in a stack and the self-maintenance block 110 on each integrated circuit chip 101a-101n can be integrated with any adjacent self-maintenance blocks of any adjacent integrated circuit chips in the stack using the interconnect structures 130 (e.g., using the multiplexers 136-138 and through-substrate-vias 131-132, as described in detail above with regard to the structure embodiments).

Once the integrated circuit chips are packaged into the stacked chip module 100 at process 506, the level of each integrated circuit chip in the stack can be determined using the enumeration circuitry 180 (508) and stacked chip module-level servicing (i.e., self-testing or self-repairing, as applicable) of the functional blocks 120 on the integrated circuit chips 101a-101n in the stack can be performed such that, during the stacked chip module-level servicing, the first controllers 111 on each of the integrated circuit chips 101a-101n continue to control servicing of their respective functional blocks 120 but a single second controller 112 on a single one of the integrated circuit chips in the stack (e.g., the bottom integrated circuit chip 101a) provides the only interface 141 between the off-chip tester 150 and each first controller 111 on each of the integrated circuit chips 101a-101n in the stack (510). In the case, the second controller 112 on each of the other integrated circuit chips in the stack (e.g., the higher integrated circuit chips 101b-101n in the stack) simply provide the required buffering needed for servicing. It should be noted that, due to the configuration of the interconnect structures 130 and particularly the control signals used to control the multiplexers 138 (as discussed in detail above with regard to the structure embodiments), this stacked chip module level servicing can be performed so that any integrated circuit chips identified, during wafer-level servicing at process 505, as having defective first or second controllers 111, 112 can be automatically bypassed (511).

By integrating the self-maintenance blocks 110 of adjacent integrated circuit chips in the stacked chip module 100, at process 506, the single second controller 112, as controlled by the off-chip tester 150, can cause the functional block 120 on each of the integrated circuit chips 101a-101n in the stack to be serviced in a variety of different manners during the stacked chip module-level servicing at process 510. For example, to reduce test time the functional block 120 on each of the integrated circuit chips 101a-101n in the stack can be serviced in parallel (512). Alternatively, to avoid noise/power issues, the functional block 120 on each of the integrated circuit chips 101a-101n in the stack can be serviced in series. Alternatively, to balance out the need for reduced test time with the need to avoid noise/power issues, servicing can be partitioned such that the functional blocks on each integrated circuit chip in a selected group of less than all of the integrated circuit chips (e.g., integrated circuit chips 101a and 101n only) in the stack are serviced in parallel (513).

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore disclosed above are embodiments of a stacked chip module with integrated circuit chips having integratable built-in self-maintenance blocks to allow for servicing (e.g., self-testing or self-repairing) of functional blocks at both the wafer-level and the stacked chip module-level. Specifically, the stacked chip module can comprise a stack of integrated circuit chips. Each integrated circuit chip can comprise a functional block and a self-maintenance block. Each self-maintenance block can comprise a first controller and a second controller. The first controller can control both wafer-level and stacked chip module-level servicing of the functional block. The second controller can provide an interface between an off-chip tester and the first controller during wafer-level servicing. Each integrated circuit chip can further comprise a plurality of interconnect structures (e.g., multiplexers and through-substrate-vias) that integrate the self-maintenance blocks of adjacent integrated circuit chips in the stack so that, during stacked chip module-level servicing, a single second controller on a single one of the integrated circuit chips in the stack (e.g., the bottom integrated circuit chip in the stack) provides the only interface between the off-chip tester and all of the first controllers. Also disclosed herein are embodiments of an associated method of manufacturing and serving such a stacked chip module.

The above-described embodiments provide a means for easily applying two-dimensional (2D) test/repair methodology (i.e., wafer-level test/repair methodology) to three-dimensional structures (i.e., to stacked chip modules). That is, the embodiments provide a technique for easily reusing the same self-maintenance blocks and same test patterns in both wafer-level and stacked chip module level servicing. In an automated manufacturing environment, this technique results in reduced costs, risks, debugging efforts, etc. Furthermore, since the embodiments incorporate interconnect structures that are regular (i.e., repeatable, not customized), they can be readily inserted and verified in an application specific integrated circuit (ASIC) environment.

What is claimed is:

1. A stacked chip module comprising a stack of integrated circuit chips, each of said integrated circuit chips in said stack comprising:
    a functional block on a substrate;
    a self-maintenance block on said substrate, said self-maintenance block comprising:
        a first controller controlling servicing of said functional block during wafer-level servicing and during module-level servicing; and
        a second controller providing an interface between an off-chip tester and said first controller during wafer-level servicing; and
    a plurality of interconnect structures on said substrate and integrating said self-maintenance block with an adjacent self-maintenance block of at least one adjacent integrated circuit chip in said stack such that, during module-level servicing, a single second controller on a single integrated circuit chip in said stack provides an interface between said off-chip tester and each first controller on each of said integrated circuit chips in said stack.

2. The stacked chip module of claim 1, said functional block comprising a memory array.

3. The stacked chip module of claim 1, said servicing of said functional block comprising any one of self-testing and self-repairing.

4. The stacked chip module of claim 1, said single second controller causing said functional block on each of said integrated circuit chips in said stack to be serviced in parallel during said module-level servicing.

5. The stacked chip module of claim 1, said single second controller causing said functional block on each integrated circuit chip in a selected group of less than all of said integrated circuit chips in said stack to be serviced in parallel during said module-level servicing.

6. A stacked chip module comprising a stack of integrated circuit chips, each of said integrated circuit chips in said stack comprising:
    a functional block on a substrate;
    a self-maintenance block on said substrate, said self-maintenance block comprising:
        a first controller controlling servicing of said functional block during wafer-level servicing and during module-level servicing; and
        a second controller providing an interface between an off-chip tester and said first controller during said wafer-level servicing; and
    a plurality of multiplexers and a plurality of through-substrate-vias on said substrate and integrating said self-maintenance block with an adjacent self-maintenance block of at least one adjacent integrated circuit chip in said stack such that, during said module-level servicing, a single second controller on a bottom integrated circuit chip in said stack provides an interface between said off-chip tester and each first controller on each of said integrated circuit chips in said stack.

7. The stacked chip module of claim 6,
    said plurality of through-substrate-vias comprising a first through-substrate-via and a second through-substrate-via, and
    said plurality of multiplexers comprising:
        a first multiplexer receiving first input signals from said first through-substrate-via and from said second controller and controlled by a first control signal indicating whether said integrated circuit chip is said bottom integrated circuit chip in said stack;
        a second multiplexer receiving second input signals from said first controller and from said second through-substrate-via of a next higher integrated circuit chip in said stack and controlled by a second control signal indicating whether said integrated circuit chip is a top integrated circuit chip in said stack; and
        a third multiplexer receiving third input signals from said first multiplexer and said first controller, outputting an output signal to said first through-substrate-via of said next higher integrated circuit chip and controlled by a third control signal indicating a condition of said first controller on said integrated circuit chip, said condition being one of defective and functional.

8. The stacked chip module of claim 7, each of said integrated circuit chips in said stack further comprising:
   first termination logic electrically connected between said first through-substrate-via and said first multiplexer, said first termination logic controlled by said first control signal; and
   second termination logic electrically connected to said second multiplexer, said second termination logic controlled by said second control signal.

9. The stacked chip module of claim 7, each integrated circuit chip in said stack further comprising enumeration circuitry on said substrate and electrically connected to adjacent enumeration circuitry on at least one adjacent integrated circuit chips in said stack, said enumeration circuitry receiving and processing an enumeration signal to determine a level of said integrated circuit chip in said stack and output said first control signal and said second control signal.

10. The stacked chip module of claim 9, each of said integrated circuit chips in said stack further comprising an additional through-substrate-via and said enumeration circuitry comprising:
   a latch receiving said enumeration signal from said additional through-substrate-via;
   a counter electrically connected in series with said latch, said counter counting a number of cycles until said enumeration signal is received; and
   at least one register in communication with said counter and comparing said number to a predetermined minimum number to output said first control signal and to a predetermined maximum number to output said second control signal.

11. The stacked chip module of claim 6, said servicing of said functional block comprising any one of self-testing and self-repairing.

12. The stacked chip module of claim 6, said functional block comprising a memory array.

13. The stacked chip module of claim 6, said single second controller causing said functional block on each of said integrated circuit chips in said stack to be serviced in parallel during said module-level servicing.

14. The stacked chip module of claim 6, said single second controller causing said functional block on each integrated circuit chip in a selected group of less than all of said integrated circuit chips in said stack to be serviced in parallel during said module-level servicing.

15. A stacked chip module manufacturing method comprising:
   manufacturing integrated circuit chips to be incorporated into a stacked chip module;
   performing wafer-level servicing of a functional block of each integrated circuit chip, said performing of said wafer-level servicing comprising:
      controlling, by a first controller of a self-maintenance block on said integrated circuit chip, servicing of said functional block; and
      providing, by a second controller of said self-maintenance block on said integrated circuit chip, an interface between an off-chip tester and said first controller; and
   after said wafer-level servicing, packaging said integrated circuit chips to complete said stacked chip module, said packaging comprising arranging said integrated circuit chips in a stack and integrating said self-maintenance block on each integrated circuit chip with an adjacent self-maintenance block of at least one adjacent integrated circuit chip in said stack using a plurality of interconnect structures, said integrating enabling performance of module-level servicing of functional blocks on said integrated circuit chips in said stack after completion of said stacked chip module such that, during said module-level servicing, a single second controller on a single integrated circuit chip in said stack provides an interface between said off-chip tester and each first controller on each of said integrated circuit chips in said stack.

16. The method of claim 15, said functional block comprising a memory array.

17. The method of claim 15, said servicing of said functional block comprising any one of self-testing and self-repairing.

18. The method of claim 15, said module-level servicing comprising servicing all of said functional blocks in parallel.

19. The method of claim 15, said module-level servicing comprising servicing only some of said functional blocks in parallel.

20. A stacked chip module manufacturing method comprising:
   manufacturing integrated circuit chips to be incorporated into a stacked chip module;
   performing wafer-level servicing of a functional block of each integrated circuit chip, said performing of said wafer-level servicing comprising:
      controlling, by a first controller of a self-maintenance block on said integrated circuit chip, servicing of said functional block; and
      providing, by a second controller of said self-maintenance block on said integrated circuit chip, an interface between an off-chip tester and said first controller; and,
   after said wafer-level servicing, packaging said integrated circuit chips to complete said stacked chip module, said packaging comprising arranging said integrated circuit chips into a stack and integrating said self-maintenance block on each integrated circuit chip with an adjacent self-maintenance block of at least one adjacent integrated circuit chip in said stack using a plurality of multiplexers and through-substrate-vias, said integrating enabling performed of module-level servicing of functional blocks on said integrated circuit chips in said stack after completion of said stacked chip module such that, during said module-level servicing, a single second controller on a bottom integrated circuit chip in said stack provides an interface between said off-chip tester and each first controller on each of said integrated circuit chips in said stack.

21. The method of claim 20, said functional block comprising a memory array.

22. The method of claim 20, said servicing of said functional block comprising any one of self-testing and self-repairing.

23. The method of claim 20, said module-level servicing comprising servicing all of said functional blocks in parallel.

24. The method of claim 20, said module-level servicing comprising servicing only some of said functional blocks in parallel.

25. The method of claim 20, further comprising, before said module-level servicing, determining, by enumeration circuitry on each integrated circuit chip, a level of said integrated circuit chip in said stack.

* * * * *